United States Patent
Ikeda et al.

(10) Patent No.: US 6,923,875 B2
(45) Date of Patent: Aug. 2, 2005

(54) SOLDER PRECIPITATING COMPOSITION

(75) Inventors: Kazuki Ikeda, Hyogo (JP); Hiroshi Tanaka, Hyogo (JP); Hisao Irie, Hyogo (JP); Keigo Obata, Hyogo (JP); Takao Takeuchi, Hyogo (JP); Naoya Inoue, Hyogo (JP)

(73) Assignee: Harima Chemicals, Inc., Kakogawa (JP)

( * ) Notice: Subject to any disclaimer, the term of this patent is extended or adjusted under 35 U.S.C. 154(b) by 183 days.

(21) Appl. No.: 10/342,210

(22) Filed: Jan. 15, 2003

(65) Prior Publication Data
US 2003/0159761 A1 Aug. 28, 2003

(30) Foreign Application Priority Data

Feb. 28, 2002 (JP) .......................... 2002-052849

(51) Int. Cl.$^7$ .............................. C23C 18/00
(52) U.S. Cl. ........................... 148/24; 228/209
(58) Field of Search .................... 148/24; 228/209

(56) References Cited

U.S. PATENT DOCUMENTS

| | | |
|---|---|---|
| 2,950,184 A | 8/1960 | Johnson et al. |
| 5,021,269 A | 6/1991 | Kono et al. |
| 5,118,029 A | 6/1992 | Fuse et al. |
| 5,145,532 A | 9/1992 | Fukunaga et al. |
| 5,296,649 A | 3/1994 | Kosuga et al. |
| 5,453,582 A | 9/1995 | Amano et al. |
| 5,601,228 A | 2/1997 | Fukunaga et al. |
| 6,132,646 A * | 10/2000 | Zhou et al. ............... 252/512 |

FOREIGN PATENT DOCUMENTS

| | | |
|---|---|---|
| JP | 03-081093 | 4/1991 |
| JP | 07/155985 | 6/1995 |
| JP | 09-141490 | 6/1997 |
| JP | 11-058065 | 3/1999 |
| JP | 11-254184 | 9/1999 |
| WO | WO 98/08362 | 2/1998 |

* cited by examiner

*Primary Examiner*—Melvyn Andrews
(74) *Attorney, Agent, or Firm*—Sughrue Mion, PLLC

(57) ABSTRACT

According to present invention, there is provided a lead-free solder precipitating composition comprising a tin powder, and a complex of silver ions and/or copper ions and aryl phosphines, alkyl phosphine, phosphines or azoles. The solder precipitating composition can form proper lead-free solder on lands of a circuit board, without forming silver and/or copper film on the circuit board.

10 Claims, No Drawings

SOLDER PRECIPITATING COMPOSITION

FIELD OF THE INVENTION

The present invention relates to solder precipitating compositions capable of forming lead-free solder alloys, such as tin/silver and tin/silver/copper, chemically by heating, and a solder precipitation method using said compositions.

BACKGROUND OF THE INVENTION

In the case of soldering electronic components onto a circuit board of an electronic device, there has hitherto been employed a method comprising supplying a solder paste, which is prepared by mixing a solder powder with a flux, on the lands of a circuit board by screen-printing, heating solder paste to form solder layer on the lands, mounting the electronic components on the solder layer prepared above, and melting the solder layer again with heating, thereby jointing the electronic components with the lands through solder.

Due to the size and weight reduction trend in electronics, an electronic component tends to have greater number of terminals with fine pitch. Consequently, the lands of a circuit board also need to array at very small intervals within small area.

It is considerably difficult to supply a solder paste onto the fine pitch lands only by screen-printing. Furthermore, the fine pitch lands might cause solder bridging wherein solder joints two or more conductive parts (i.e. short-circuiting), and thereby it results in poor electrical insulation.

As a method of solder pre-coating on the fine pitch lands, there has been known a method of applying a solder precipitating composition containing a tin powder and a lead salt of an organic acid to wide area including the lands and the space portion thereof, and heating the composition to form tin-lead solder on the lands through the substitution between a portion of tin particle and organo-lead salt under the heat (see U.S. Pat. No. 5,145,532).

However, since environmental pollution due to toxicity of lead has recently become a serious problem, so-called lead-free solder is used for electronics assembly. The conventional lead-free solder alloys in the form of solder pastes are mainly tin-silver, tin-copper and tin-silver-copper solders.

According to the principle of alloy formation by the above solder precipitating composition, it is also possible to obtain the lead-free solder with use of tin powder and a silver salt or a copper salt, where the substitution between a portion of tin particle and such organometallic salts gives lead-free alloys as described above.

However, the lead-free solder precipitating composition has the potential problem in feasible reductive precipitation of organometallic salts to form metal film on the surface of a circuit board (between lands) under the heat. The metal film can not be removed by cleaning so that it makes electrical insulation reliability worse.

Solder alloy formation through substitution between a portion of tin particle and organo-silver salts or organo-copper salts competes with the metal film formation as described above. Therefore, in case that reductive precipitation of organometallic salts would be induced at relatively low temperature wherein the metal film formation proceeds predominantly over the substitution, it is very difficult to adjust final composition of solder alloy.

SUMMARY OF THE INVENTION

A main object of the present invention is to provide solder precipitating compositions of tin-silver, tin-copper or tin-silver-copper solder, which can form proper lead-free solder on lands of a circuit board with inhibiting silver and/or copper film formation on a circuit board.

Another object of the present invention is to provide a solder precipitation method in which solder precipitating compositions would give proper lead-free solders on the lands of a circuit board.

The solder precipitating composition of the present invention comprises a tin powder; and a complex of at least one selected from silver ions and copper ions and at least one selected from aryl phosphines, alkyl phosphines and azoles.

In the present invention, it should be interpreted that the term "tin powder" includes, for example, tin-silver alloy (eutectic) powder containing silver, and tin-copper alloy (eutectic) powder containing copper, as well as metallic tin powder.

As the aryl phosphines and the alkyl phosphines, compounds represented by the following general formula (1) can be used alone or a mixture of two or more of them can be used.

wherein $R_1$, $R_2$ and $R_3$ each represents a substituted or non-substituted aryl group, or a substituted or non-substituted chain or cyclic alkyl group having 1 to 8 carbon atoms; hydrogen of the aryl group may be substituted with an alkyl having 1 to 8 carbon atoms, an alkoxy group having 1 to 8 carbon atoms, a hydroxyl group, an amino group or a halogen atom at any position; hydrogen of the alkyl group may be substituted with an alkoxy group having 1 to 8 carbon atoms, an aryl group, a hydroxyl group, an amino group or a halogen at any position; and $R_1$, $R_2$ and $R_3$ may be the same or different.

The solder precipitating composition described in the present invention can be mixed with a flux component used in soldering and/or a requisite solvent.

The solder precipitation method of the present invention is characterized by heating the solder precipitating composition applied to wide area including both lands and the space portion thereof in a circuit board, and then forming solder alloy layer on the lands.

The solder precipitation method of the present invention is characterized by applying the solder precipitating composition on the surface on which solder is to be precipitated, and heating the solder precipitating composition. That is, when the solder precipitating composition of the present invention is applied to a wide area including lands and the space portion thereof in a circuit board and then heated, silver and/or copper in the complex is substituted with metallic tin to selectively precipitate an solder alloy on the lands.)

When heated, the complexes in the present invention supply silver and/or copper ions for the substitution only, where some of tin atoms would be replaced with silver and/or copper atoms because of the difference in the ionization tendency.

Consequently, reductive precipitated silver and/or copper atoms from the complexes are taken in tin particles to form solder alloy without generating silver and/or copper film on a circuit board. In the meantime, the deposited solder alloy above has good wettability with copper which constitutes lands, so that it can form solder layer on the copper lands (through metal bond).

DETAILED DESCRIPTION OF THE INVENTION

The precipitating composition of the present invention contains the tin powder and the complex of silver and/or copper. When heated, the complex is decomposed to precipitate silver and/or copper on the surface of tin particles through substitution reaction, and thus lead-free solder alloys such as tin-silver, tin-copper or tin-silver-copper are formed.

In the present invention, it should be interpreted that the term "tin powder" includes, for example, tin-silver alloy (eutectic) powder containing silver, and tin-copper alloy (eutectic) powder containing copper, as well as metallic tin powder.

As the complex of silver and/or copper, a complex of silver ions and/or copper ions and phosphines or azoles is preferably used, or a mixture of two or more of these complexes can be used.

As the phosphines, for example, compounds represented by the general formula (1) are preferred. Specifically, aryl phosphines such as triphenyl phosphine, tri(o-, m- or p-tolyl) phosphine and tri(p-methoxyphenyl) phosphine, or alkyl phosphines such as tributyl phosphine, trioctyl phosphine, tris(3-hydroxypropyl) phosphine and tribenzyl phosphine are preferably used.

Among these compounds, triphenyl phosphine, tri(p-tolyl) phosphine, tri(p-methoxyphenyl) phosphine, trioctyl phosphine and tris(3-hydroxypropyl) phosphine are used particularly preferably, and triphenyl phosphine, tri(p-tolyl) phosphine and tri(p-methoxyphenyl) phosphine are used most preferably.

Since the complex consisting of silver ions and/or copper ions and phosphines is cationic, an anionic ion is necessary as a counter anion. Examples of the counter anions include organic sulfonic acid ions, organic carboxylic acid ions, halogen ions, nitric acid ions and sulfuric acid ions, and organic sulfonic acid ions are particularly preferred.

As the organic sulfonic acid used as the counter anions, organic-sulfonic acids represented by the following general formulas (2), (3) and (4) are preferably used alone, or a mixture of two or more of them are preferably used.

$$(X_1)_n-R_4-SO_3H \quad (2)$$

wherein $R_4$ represents an alkyl group having 1 to 18 carbon atoms, an alkenyl group having 2 to 18 carbon atoms or an alkynyl group having 2 to 18 carbon atoms, $X_1$ represents a hydroxyl group, an alkyl group having 1 to 8 carbon atoms, an alkoxy group having 1 to 8 carbon atoms, an aryl group, an aralkyl group, a carboxyl group or a sulfo group, n represents an integer of 0 to 3, and $X_1$ may be bonded at any position of $R_4$.

$$(X_2)_n-R_5-(SO_3H)_m \quad (3)$$

wherein $R_5$ represents an alkyl group having 1 to 18 carbon atoms, and when the alkyl group has 1 to 3 carbon atoms, a hydroxyl group may be substituted at any position of the alkyl group; $X_2$ represents chlorine or fluorine; n represents an integer of not less than 1 and not more than the number of hydrogen capable of bonding with $R_5$; $X_2$ may be bonded with $R_5$ at any position; and m represents an integer of 1 to 3.

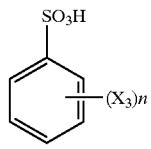

(4)

wherein $X_3$ represents a hydroxyl group, an alkyl group having 1 to 18 carbon atoms, an alkoxy group having 1 to 8 carbon atoms, an aryl group, an aralkyl group, an aldehyde group, a carboxyl group, a nitro group, a mercapto group, a sulfo group or an amino group, or two adjacent $X_3$(s) may form a ring to form a naphthalene ring with a benzene ring, and n represents an integer of 0 to 3.

Specific examples of preferred organic sulfonic acid include methanesulfonic acid, methanedisulfonic acid, methanetrisulfonic acid, trifluoromethanesulfonic acid, ethanesulfonic acid, propanesulfonic acid, 2-propanesulfonic acid, butanesulfonic acid, 2-butanesulfonic acid, pentanesulfonic acid, hexanesulfonic acid, decanesulfonic acid, dodecanesulfonic acid, hexadecanesulfonic acid, octadecanesulfonic acid, 2-hydroxyethanesulfonic acid, 1-hydroxypropane-2-sulfonic acid, 3-hydroxypropane-1-sulfonic acid, 2-hydroxypropane-1-sulfonic acid, 2-hydroxybutanesulfonic acid, 2-hydroxypentanesulfonic acid, 2-hydroxyhexane-1-sulfonic acid, 2-hydroxydecanesulfonic acid, 2-hydroxydodecanesulfonic acid, 1-carboxyethanesulfonic acid, 2-carboxyethanesulfonic acid, 1,3-propanedisulfonic acid, allylsulfonic acid, 2-sulfoacetic acid, 2- or 3-sulfopropionic acid, sulfosuccinic acid, sulfomaleic acid, sulfofumaric acid, monochloromethanesulfonic acid, trichloromethanesulfonic acid, perchloroethanesulfonic acid, trichlorodifluoropropanesulfonic acid, perfluoroethanesulfonic acid, monochlorodifluoromethanesulfonic acid, trifluoromethanesulfonic acid, trifluoroethanesulfonic acid, tetrachloropropanesulfonic acid, trichlorodifluoroethanesulfonic acid, monochloroethanolsulfonic acid, dichloropropanolsulfonic acid, monochlorodifluorohydroxypropanesulfonic acid, benzenesulfonic acid, toluenesulfonic acid, xylenesulfonic acid, nitrobenzenesulfonic acid, sulfobenzoic acid, sulfosalicylic acid, benzaldehydesulfonic acid, phenolsulfonic acid, phenol-2,4-disulfonic acid, anisolesulfonic acid, 2-sulfoacetic acid, 2-sulfopropionic acid, 3-sulfopropionic acid, sulfosuccinic acid, sulfomethylsuccinic acid, sulfofumaric acid, sulfomaleic acid, 2-sulfobenzoic acid, 3-sulfobenzoic acid, 4-sulfobenzoic acid, 5-sulfosalicylic acid, 4-sulfophthalic acid, 5-sulfoisophthalic acid, 2-sulfoterephthalic acid and naphthalenesulfonic acid.

Among these organic sulfonic acids, methanesulfonic acid, 2-hydroxyethanesulfonic acid, 2-hydroxypropane-1-sulfonic acid, trichloromethanesulfonic acid, trifluoromethanesulfonic acid, benzenesulfonic acid, toluenesulfonic acid, phenolsulfonic acid, cresolsulfonic acid, anisolesulfonic acid and naphthalenesulfonic acid are used more preferably, and methanesulfonic acid, toluenesulfonic acid and phenolsulfonic acid are particularly preferred.

As the organic carboxylic acid used as the counter anions, for example, monocarboxylic acids such as formic acid, acetic acid, propionic acid, butanoic acid and octanoic acid; dicarboxylic acids such as oxalic acid, malonic acid and succinic acid; hydroxycarboxylic acids such as lactic acid, glycolic acid, tartaric acid and citric acid; and halogen-substituted carboxylic acids such as monochloroacetic acid, dichloroacetic acid, trichloroacetic acid, trifluoroacetic acid and perfluoropropionic acid are preferably used.

Among these organic carboxylic acids, formic acid, acetic acid, oxalic acid, lactic acid, trichloroacetic acid, trifluoroacetic acid and perfluoropropionic acid are preferred, and acetic acid, lactic acid and trifluoroacetic acid are particularly preferred.

As the azoles, for example, tetrazole, triazole, benzotriazole, imidazole, benzimidazole, pyrazole, indazole, thiazole, benzothiazole, oxazole, benzoxazole, pyrrole, indole and derivatives thereof can be used alone, or a mixture of two or more of them can be used.

Examples of the tetrazole and derivative thereof include tetrazole, 5-aminotetrazole, 5-mercapto-1-methyltetrazole and 5-mercapto-1-phenyltetrazole, and examples of the triazole, benzotriazole and derivative include 1,2,3-triazole, 1,2,3-triazole-4,5-dicarboxylic acid, 1,2,4-triazole, 3-amino-1,2,4-triazole, 4-amino-1,2,4-triazole, 3-mercapto-1,2,4-triazole, benzotriazole, 5-methyltriazole, tolyltriazole, benzotriazole-5-carboxylic acid, carboxybenzotriazole, 4-aminobenzotriazole, 5-aminobenzotriazole, 4-nitrobenzotriazole, 5-nitrobenzotriazole and 5-chlorobenzotriazole.

Examples of the imidazole, benzimidazole and derivative thereof include imidazole, 1-methylimidazole, 1-phenylimidazole, 2-methylimidazole, 2-ethylimidazole, 2-propylimidazole, 2-butylimidazole, 2-phenylimidazole, 4-methylimidazole, 4-phenylimidazole, 2-aminoimidazole, 2-mercaptoimidazole, imidazole-4-carboxylic acid, benzimidazole, 1-methylbenzimidazole, 2-methylbenzimidazole, 2-ethylbenzimidazole, 2-butylbenzimidazole, 2-octylbenzimidazole, 2-phenylbenzimidazole, 2-trifluoromethylbenzimidazole, 4-methylbenzimidazole, 2-chlorobenzimidazole, 2-hydroxybenzimidazole, 2-aminobenzimidazole, 2-mercaptobenzimidazole, 2-methylthiobenzimidazole, 5-nitrobenzimidazole and benzimidazole-5-carboxylic acid.

Examples of the pyrazole, indazole and derivative thereof include pyrazole, 3-methylpyrazole, 4-methylpyrazole, 3,5-dimethylpyrazole, 3-trifluoromethylpyrazole, 3-aminopyrazole, pyrazole-4-carboxylic acid, 4-bromopyrazole, 4-iodopyrazole, indazole, 5-aminoindazole, 6-aminoindazole, 5-nitroindazole and 6-nitroindazole. Examples of the thiazole, benzothiazole and derivative thereof include thiazole, 4-methylthiazole, 5-methylthiazole, 4,5-dimethylthiazole, 2,4,5-trimethylthiazole, 2-bromothiazole, 2-aminothiazole, benzothiazole, 2-methylbenzothiazole, 2,5-dimethylbenzothiazole, 2-phenylbenzothiazole, 2-chlorobenzothiazole, 2-hydroxybenzothiazole, 2-aminobenzothiazole, 2-mercaptobenzothiazole and 2-methylthiobenzothiazole. Examples of the oxazole, benzoxazole and derivative thereof include isoxazole, anthranyl, benzoxazole, 2-methylbenzoxazole, 2-phenylbenzoxazole, 2-chlorobenzoxazole, 2-benzooxazolinone and 2-mercaptobenzoxazole.

Examples of the pyrrole, indole and derivative thereof include pyrrole, 2-ethylpyrrole, 2,4-dimethylpyrrole, 2,5-dimethylpyrrole, pyrrole-2-carboxyaldehyde, pyrrole-2-carboxylic acid, 4,5,6,7-tetrahydroindole, indole, 2-methylindole, 3-methylindole, 4-methylindole, 5-methylindole, 6-methylindole, 7-methylindole, 2,3-dimethylindole, 2,5-dimethylindole, 2-phenylindole, 5-fluoroindole, 4-chloroindole, 5-chloroindole, 6-chloroindole, 5-bromoindole, 4-hydroxyindole, 5-hydroxyindole, 4-methoxyindole, 5-methoxyindole, 5-aminoindole, 4-nitroindole, 5-nitroindole, indole-3-carboxyaldehyde, indole-2-carboxylic acid, indole-4-carboxylic acid, indole-5-carboxylic acid, indole-3-acetic acid, 3-cyanoindole and 5-cyanoindole.

Among these compounds, tetrazole, 5-mercapto-1-phenyltetrazole, 1,2,3-triazole, 1,2,4-triazole, 3-mercapto-1,2,4-triazole, benzotriazole, tolyltriazole, carboxybenzotriazole, imidazole, 2-mercaptoimidazole, benzimidazole, 2-octylbenzimidazole, 2-phenylbenzimidazole, 2-mercaptobenzimidazole, 2-methylthiobenzimidazole, pyrazole, indazole, thiazole, benzothiazole, 2-phenylbenzothiazole, 2-mercaptobenzothiazole, 2-methylthiobenzothiazole, isoxazole, anthranyl, benzoxazole, 2-phenylbenzoxazole, 2-mercaptobenzoxazole, pyrrole, 4,5,6,7-tetrahydroindole and indole are preferred.

Among these compounds, 5-mercapto-1-phenyltetrazole, 3-mercapto-1,2,4-triazole, benzotriazole, tolyltriazole, carboxybenzotriazole, imidazole, benzimidazole, 2-octylbenzimidazole, 2-mercaptobenzimidazole, benzothiazole, 2-mercaptobenzothiazole, benzoxazole and 2-mercaptobenzoxazole are used particularly preferably.

The composition described above can be mixed with a flux and/or a solvent to form the solder precipitating composition of the present invention. The flux used in conventional tin-silver or tin-copper solder pastes is available for the solder precipitating composition as described above. Any solvent may be available as long as it can dissolve the composition to control the viscosity and concentration.

Moreover, in the present invention, the mixture ratio of the tin powder and the complex of silver and/or copper depends on the composition of the solder alloy which it is going to be obtained. Preferably, 0.5 to 30 parts by weight of the complex of silver and/or copper and 20 to 49.5 parts by weight of the flux are mixed with 50 parts by weight of tin, but the mixture ratio can be arbitrarily adjusted in accordance with the metal content in the complex of silver and/or copper. For example, when using the silver complex having 8% of silver content, the weight mixture ratio of tin powder/the silver complex/flux would be 50/21/29 in order to obtain 96.5 Sn/3.5 Ag eutectic solder. On the other hand, in the case of the silver-complex having 50% of silver content, the above weight mixture ratio would become 50/3.3/46.7.

EXAMPLES

[Selection of Silver or Copper Compound]

The silver or copper compounds used in the solder precipitating composition of the present invention are as follows.

| | | |
|---|---|---|
| A: | $[Ag\{P(C_6H_5)_3\}_4]^+CH_3SO_3^-$ | (8% by weight) |
| B: | $[Ag\{P(C_3H_6OH)_3\}_4]^+CH_3SO_3^-$ | (10% by weight) |
| C: | $[Ag]^+C_2H_2N_3S^-$ | (50% by weight) |
| D: | $[Cu\{P(C_6H_5)_3\}_3]^+CH_3SO_3^-$ | (6% by weight) |
| E: | $[Cu\{P(C_3H_6OH)_3\}_3]^+CH_3SO_3^-$ | (7% by weight) |
| F: | $[Cu]^+C_2H_2N_3S^-$ | (35% by weight) |
| G: | $C_7H_{15}COOAg$ | (42% by weight) |
| H: | $(C_7H_{15}COO)_2Cu$ | (18% by weight) |

Each of numerical values in parenthesis indicates the mass percent of silver or copper in the corresponding compound. "$C_2H_2N_3S$" represents 3-mercapto-1,2,4-triazole.

[Preparation of Flux]

| | |
|---|---|
| WW-grade tall oil rosin | 70 parts by weight |
| Hexylcarbitol | 25 parts by weight |
| Hydrogenated castor oil | 5 parts by weight |

In accordance with the above prescription, the respective substances were mixed, heated up to 120° C. and then cooled down to room temperature to prepare a flux.

[Preparation of the Flux Including Silver or Copper Compound]

The silver or copper compound was uniformly mixed with the flux thus prepared using a three-roll mill to prepare a mixed silver or copper compound flux. A variety of combinations of each component as well as its mixing ratio are shown in Table 1.

[Preparation of Solder Precipitating Composition]

The mixed silver or copper compound flux thus prepared was mixed with a metal powder using a conditioning mixer (trade name "AWATORI-RENTARO", manufactured by THINKY Corporation) to prepare a solder precipitating composition in the form of a paste. Table 1 shows a variety of combinations of each component as well as its mixing ratio based on the mass percent.

TABLE 1

| | Flux | Silver or Copper Compound | Metallic Powder |
|---|---|---|---|
| Example 1 | 25 | A: 25 | Tin powder: 50 |
| Example 2 | 20 | A: 25 D: 5 | Tin powder: 50 |
| Example 3 | 30 | B: 20 | Tin powder: 50 |
| Example 4 | 45 | C: 5 | Tin powder: 50 |
| Example 5 | 45 | E: 5 | Tin-Silver eutectic powder: 50 |
| Example 6 | 45 | F: 5 | Tin powder: 50 |
| Comparative Example 1 | 40 | G: 10 | Tin powder: 50 |
| Comparative Example 2 | 30 | H: 20 | Tin powder: 50 |

[Solder Precipitation Test]

1. Solder Alloy Precipitation on Lands

The tape carrier package (TCP) circuit board used in the test was 40 mm square in which lands have peripheral array with 0.25 mm pitch. Each of solder precipitating compositions in Table 1 was screen-printed on both lands and space portion thereof using a 150 μm thick metal mask and a squeegee made of fluororesin.

The circuit board prepared above was heated using a hot plate at 260° C. for 2 minutes, and then it was rinsed with butyl carbitol solution at 60° C. in an ultrasonic cleaning machine to remove paste residue.

Finally, the visual inspection of the, circuit board was conducted, and the portion other than lands, i.e. the surface of solder resist, was subjected to elemental analysis by means of energy-disperse fluorescent X-ray spectrometer (EDX).

2. Metal Composition of Precipitated Solder Alloy

Each of solder precipitating compositions in Table 1 was applied on a glass epoxy plate of 40 mm square. The glass epoxy plate having solder precipitating composition on itself was heated using a hot plate at 260° C. for 2 minutes so that the numerous number of metal balls were deposited on the glass epoxy plate. Those metal balls were separated from paste residue by cleaning with a solvent, and then dissolved in aqua regia. The resulting aqueous solution was subject to high-frequency plasma emission spectrochemical analysis (ICP) in order to determine the metal composition of precipitated solder alloy. The test results are shown in Table 2.

TABLE 2

| Examples | Appearance | EDX Analysis | Solder Alloy Composition | Substitution Reaction Yield |
|---|---|---|---|---|
| Example 1 | solder luster on the lands | C, O | Silver: 3.7%, Balance: tin | 95% |
| Example 2 | solder luster on the lands | C, O | Silver: 4.2%, Copper: 0.6%, Balance: tin | 96% |
| Example 3 | solder luster on the lands | C, O | Silver: 3.9%, Balance: tin | 95% |
| Example 4 | solder luster on the lands | C, O | Copper: 4.6%, Balance: tin | 95% |
| Example 5 | solder luster on the lands | C, O | Silver: 3.5%, Copper: 0.7%, Balance: tin | 97% |
| Example 6 | solder luster on the lands | C, O | Copper 3.4%, Balance: tin | 95% |
| Comparative Example 1 | black foreign compounds on solder resist | C, O, Ag | Silver: 0.8%, Balance: tin | 10% |
| Comparative Example 2 | reddish brown foreign compounds on solder resist | C, O, Cu | Copper: 1.3%, Balance: tin | 18% |

The substitution reaction yields shown in Table 2 were calculated using the following equation:

$$\text{Substitution reaction yield}(\%) = (A/B) \times 100 \quad (1)$$

A: Measured weight ratio of silver or copper in solder alloy

B: Theoretical weight ratio of silver or copper in solder alloy

The theoretical weight ratio of silver or copper (B) in equation (1) was calculated using the following equation:

$$B = \{M/[(N - P \times 1/n) \times 118.7 + M]\} \times 100$$

M: weight of silver or copper in solder paste

N: number of moles of tin in solder paste

P: number of moles of silver or copper in solder paste n: 2 (silver) or 1 (copper)

118.7: an atomic weight of tin

In the all cases of Examples, solder alloy was formed on lands in the circuit board. Besides, it was confirmed that there was no significant amount of deposited metal on solder resist of a circuit board by EDX analysis.

On the other hand, Comparative Example 1, wherein silver octanoate was used as the metal salt, generated metal silver film on the surface of solder resist in a circuit board. Comparative Example 2 which used copper octanoate gave similar result, in other words, metal copper was detected on the surface of solder resist.

It is assumed that such deposited silver or copper on the solder resist would cause short-circuiting through migration, thereby it results in the loss of electrical insulation between lands on the surface of a circuit board.

Example 1 to 6 gave high substitution (reaction) yields, such as 95% or more, respectively. In contrast, the substitution yields in Comparative Example 1 and 2 were 20% or less. It is presumed that such low yields would stem largely from feasible reductive precipitation of silver and copper carboxylates under heating.

It is considered that the substitution reaction yield of the Examples does not reach 100% because of a difference in sag property upon heating between a tin powder and a silver or copper complex. That is, the reason is estimated as follows. The tin powder tends to sediment perpendicularly upon heating and then agglomerate at the center portion while being converted into solder by means of the substitution reaction to form large solder balls, while the silver and copper complex dispersed in the flux sags outwardly with the decrease of the viscosity as a result of heating, and thus a portion of the complex does not contribute to the substitution reaction.

What is claimed is:

1. A solder precipitating composition capable of forming lead-free solder alloys comprising a tin powder; and a complex of at least one member selected from the group consisting of silver ions and copper ions and at least one member selected from the group consisting of aryl phosphines, alkyl phosphines and azoles.

2. The solder precipitating composition according to claim 1, wherein the aryl phosphines and the alkyl phosphines are represented by the following general formula (1):

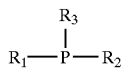

wherein $R_1$, $R_2$ and $R_3$ each represents a substituted or non-substituted aryl group, or a substituted or non-substituted chain or cyclic alkyl group having 1 to 8 carbon atoms; wherein hydrogen of the aryl group may be substituted with an alkyl having 1 to 8 carbon atoms, an alkoxy group having 1 to 8 carbon atoms, a hydroxyl group, an amino group or a halogen atom at any position; wherein hydrogen of the alkyl group may be substituted with an alkoxy group having 1 to 8 carbon atoms, an aryl group, a hydroxyl group, an amino group or a halogen at any position; and $R_1$, $R_2$ and $R_3$ may be the same or different.

3. The solder precipitating composition according to claim 2, wherein the aryl phosphines and the alkyl phosphines are at least one member selected from the group consisting of triphenyl phosphine, tri(p-tolyl) phosphine, tri(p-methoxyphenyl) phosphine, trioctyl phosphine and tris (3-hydroxypropyl) phosphine.

4. The solder precipitating composition according to claim 1, wherein the complex further contains organic sulfonic acid ions, organic carboxylic acid ions, halogen ions, nitric acid ions or sulfuric acid ions.

5. The solder precipitating composition according to claim 4, wherein the organic sulfonic acid is at least one compound represented by the following general formula (2), (3) or (4):

$$(X_1)_n\text{—}R_4\text{—}SO_3H \quad (2)$$

wherein $R_4$ represents an alkyl group having 1 to 18 carbon atoms, an alkenyl group having 2 to 18 carbon atoms or an alkynyl group having 2 to 18 carbon atoms, $X_1$ represents a hydroxyl group, an alkyl group having 1 to 8 carbon atoms, an alkoxy group having 1 to 8 carbon atoms, an aryl group, an aralkyl group, a carboxyl group or a sulfo group, n represents an integer of 0 to 3, and $X_1$ may exist at any position of $R_4$, $$(X_2)_n\text{—}R_5\text{—}(SO_3H)_m \quad (3)$$

wherein $R_5$ represents an alkyl group having 1 to 18 carbon atoms, and when the alkyl group has 1 to 3 carbon atoms, a hydroxyl group may be substituted at any position of the alkyl group; $X_2$ represents chlorine or fluorine; n represents an integer of not less than 1 and not more than the number of hydrogen capable of bonding with $R_5$; $X_2$ may be bonded with $R_5$ at any position; and m represents an integer of 1 to 3, and

wherein $X_3$ represents a hydroxyl group, an alkyl group having 1 to 18 carbon atoms, an alkoxy group having 1 to 8 carbon atoms, an aryl group, an aralkyl group, an aldehyde group, a carboxyl group, a nitro group, a mercapto group, a sulfo group or an amino group, or two adjacent $X_3$(s) may form a ring to form a naphthalene ring with a benzene ring, and n represents an integer of 0 to 3.

6. The solder precipitating composition according to claim 4, wherein the organic carboxylic acid is at least one member selected from the group consisting of formic acid, acetic acid, oxalic acid, lactic acid, trichloroacetic acid, trifluoroacetic acid and perfluoropropionic acid.

7. The solder precipitating composition according to claim 1, wherein the azoles are at least one member selected from the group consisting of tetrazole, triazole, benzotriazole, imidazole, benzimidazole, pyrazole, indazole, thiazole, benzothiazole, oxazole, benzoxazole, pyrrole, indole and derivatives thereof.

8. The solder precipitating composition according to claim 1, wherein said composition further comprises at least one member selected from the group consisting of a flux component and a solvent.

9. A solder precipitation method, which comprises applying the solder precipitating composition of claim 1 on a surface on which solder is to be precipitated, and heating the solder precipitating composition.

10. A solder precipitation method, which comprises applying the solder precipitating composition of claim 1 on areas including both lands and space portion thereof in a circuit board, and heating the solder precipitating composition to give a solder alloy.

* * * * *